United States Patent [19]
Goldstein et al.

[11] Patent Number: 5,904,955
[45] Date of Patent: May 18, 1999

[54] ENCAPSULATION MEANS AND METHOD

[75] Inventors: Robert Goldstein; Nikolai Osipenko, both of Moscow, Russian Federation; George Hawkins, Gilbert Arizona, Ariz.

[73] Assignee: Motorola, Inc., Schaumburg, Ill.

[21] Appl. No.: 08/924,862

[22] Filed: Sep. 5, 1997

[30] Foreign Application Priority Data

Sep. 30, 1996 [RU] Russian Federation ............. 96119934

[51] Int. Cl.$^6$ ............................. B01J 13/02; B05D 1/36; B05D 3/02; B05D 7/00
[52] U.S. Cl. ............................ 427/213.31; 427/213.32; 427/213.36; 427/214; 427/372.2; 427/374.1; 427/374.4; 427/384; 427/385.5; 427/402; 427/407.1; 427/407.2; 427/408; 427/409; 427/411; 427/412; 427/412.1; 264/167; 264/171.11; 264/173.16; 264/175; 425/114; 425/130; 425/131.1; 425/462
[58] Field of Search ............................ 427/213.3, 213.31, 427/213.32, 213.36, 214, 372.2, 374.1, 374.4, 384, 385.5, 388.1, 389, 389.7, 389.9, 393.5, 394, 402, 407.1, 407.2, 408, 409, 411, 412, 412.1; 264/167, 171.11, 173.16, 175; 425/114, 130, 131.1, 462

[56] References Cited

U.S. PATENT DOCUMENTS

| | | | |
|---|---|---|---|
| 4,828,780 | 5/1989 | Luker | 264/171 |
| 5,232,786 | 8/1993 | Waters et al. | 428/475.8 |
| 5,300,338 | 4/1994 | Byrd, Jr. et al. | 428/36.6 |
| 5,331,205 | 7/1994 | Primeaux | 257/790 |

*Primary Examiner*—Nathan M. Nutter
*Attorney, Agent, or Firm*—Rennie William Dover

[57] ABSTRACT

An electronic device in a cavity in a mold is encapsulated by a composite plastic having two materials placed, respectively, in sequential locations in a reservoir in the mold. The first material has desirable properties when in contact with the surface of the device, e.g., better adhesion. The second and different material has other desirable properties, e.g., mechanical strength, low moisture permeability, etc. The first location is first in line in a direction through the mold chambers to the cavity. The two-part encapsulant is injected into the cavity without significant turbulence so as to avoid much mixing of the two materials. This creates a boundary layer of the first material which preferentially applies a coating to the device while the second material substantially fills the bulk of the space in the mold cavity. A composite encapsulation is formed having overall superior properties.

18 Claims, 4 Drawing Sheets

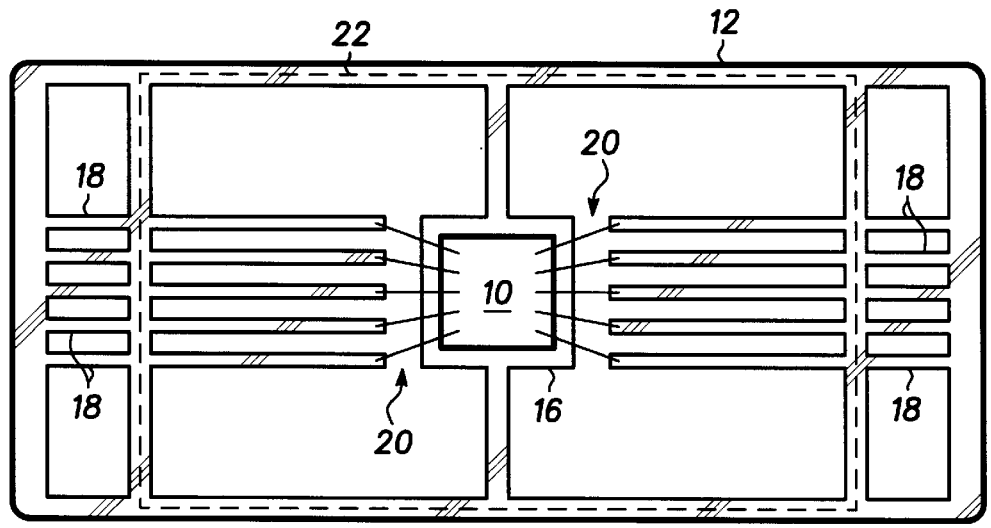
- PRIOR ART -   FIG. 1
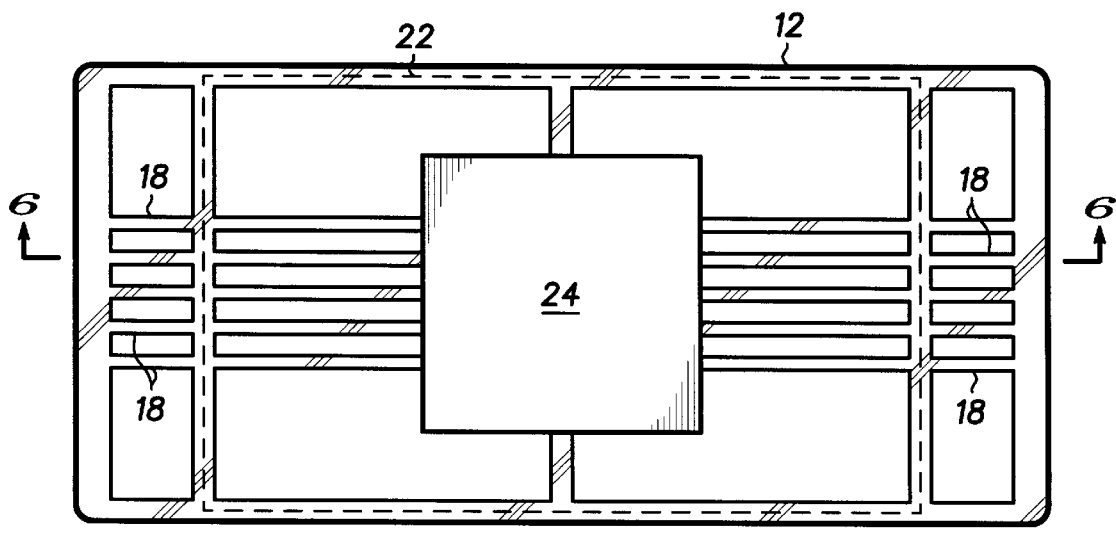
- PRIOR ART -   FIG. 2

ENCAPSULATION MEANS AND METHOD

FIELD OF THE INVENTION

The present invention concerns an improved means and method for encapsulating objects, especially electronic devices.

BACKGROUND OF THE INVENTION

It is common in the electronic art to encapsulate various devices to protect them from the ambient atmosphere in which they will be used. The word "device", singular or plural, is intended to include any type of component, electronic or not. Non-limiting examples of devices of particular commercial interest are electronic components, transistors, integrated circuits, LED's, acousto-optical devices, sensors, transducers, and so forth.

Plastic is a common encapsulant material for electronic devices. The device is typically coated with the plastic encapsulant by molding or potting. Two well known molding techniques are injection molding and transfer molding. With these techniques, the device is placed in a cavity in a mold, the mold closed and the plastic encapsulant is forced under pressure from a reservoir through various channels into the mold cavity so as to surround the device. Potting generally includes dipping the object into a liquid plastic or pouring a liquid plastic around the device. A mold may or may not be used for potting.

A great variety of plastic materials are used for encapsulation. Such materials and associated molding and potting techniques are well known in the art. In many cases, the electronic device is mounted on a leadframe or header before being encapsulated. As used herein, the word "leadframe" is intended to include any type of device support structure. Non-limiting examples are metal, ceramic or plastic headers, bases or circuit boards, and metal leadframes and pin-grid arrays, and combinations thereof.

A long standing problem with plastic encapsulation is that encapsulation materials with good mechanical and electrical properties, often do not adhere to the electronic device or its associated leadframe as well as is desired. By altering the composition of the encapsulant, it is possible to raise or lower its relative adhesion to different kinds of surfaces, e.g., metal, ceramic, oxide, nitride and semiconductor, to name a few.

Low adhesion is undesirable because it allows minute crevices to form where the plastic encapsulant separates from the surface of the leadframe or device. These crevices form pathways whereby ambient gases and moisture can penetrate and thereby degrade device performance, stability and reliability. Despite many years of effort by numerous researchers, it has not been possible to find means and methods for plastic encapsulation that simultaneously give both excellent mechanical and electrical properties and high adhesion of the encapsulant to leadframe and device surfaces. Accordingly, a need continues to exist for improved means and methods for encapsulating objects, especially electronic devices, that impart better adhesion without adverse impact on the mechanical and electrical properties of the encapsulation as a whole or on the finished device.

BRIEF DESCRIPTION OF THE DRAWINGS

FIG. 1 is a simplified top view of a conventional electronic device mounted on a leadframe, prior to encapsulation;

FIG. 2 shows the same view as in FIG. 1 but after encapsulation;

Like reference numbers are used to identify the same or analogous elements in the several figures.

DETAILED DESCRIPTION OF THE PREFERRED EMBODIMENT

Figure 3:
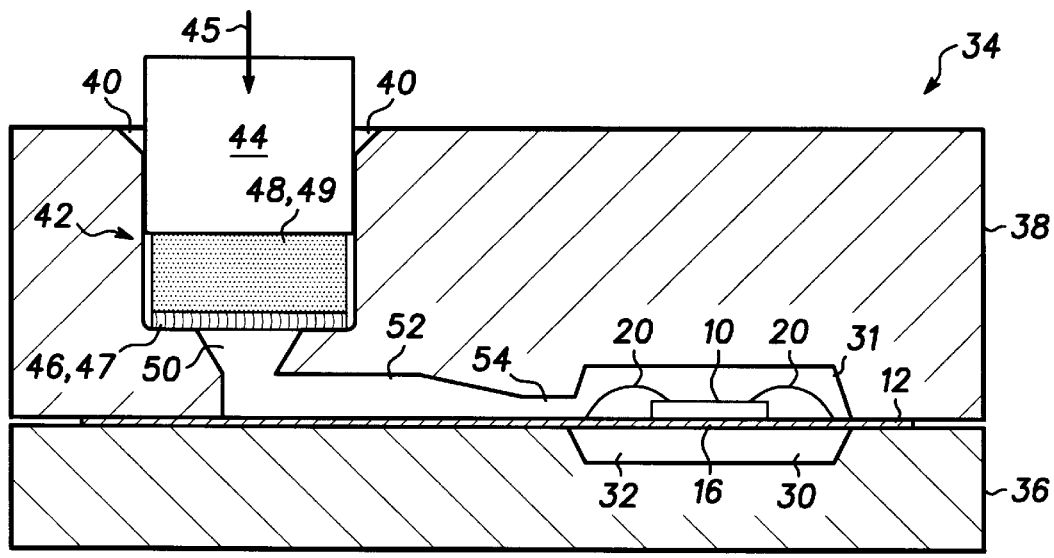
FIG. 3 is a partial cut-away and cross-sectional side view, according to the present invention, of an electronic device in a mold cavity, after an encapsulant has been placed in the mold but before being injected into the mold cavity around the device.

FIG. 1 is a simplified top view of a conventional electronic device 10 (e.g., a semiconductor integrated circuit die) mounted on leadframe 12, prior to encapsulation.

FIG. 2 is the same view after encapsulation and before lead clip. The combination of device 10 and leadframe 12 is denoted by reference number 14.

Device 10 is mounted on die flag 16 and electrically coupled to package leads 18 by wire bonds 20. Dashed outline 22 illustrates where the mold closes on leadframe 12 during encapsulation. This is referred to in the art as a "dam bar". Plastic encapsulation 24 is molded around die 10, die flag 16 and wirebonds 20. Plastic encapsulation 24 is molded around die 10, die flag 16 wirebonds 20 and the interior ends of package leads 18. The portions of the dam bar lying between package leads 18 and the remainder of leadframe 12 are sheared away after encapsulation. The foregoing is conventional.

Persons of skill in the art will understand that semiconductor die 10, leadframe 12, die flag 16, leads 18 and wirebonds 20 are illustrated merely for convenience of explanation and not intended to be limiting, since the present invention is applicable to any kind of object, although especially useful with electronic devices and particularly semiconductor devices.

Figure 4:
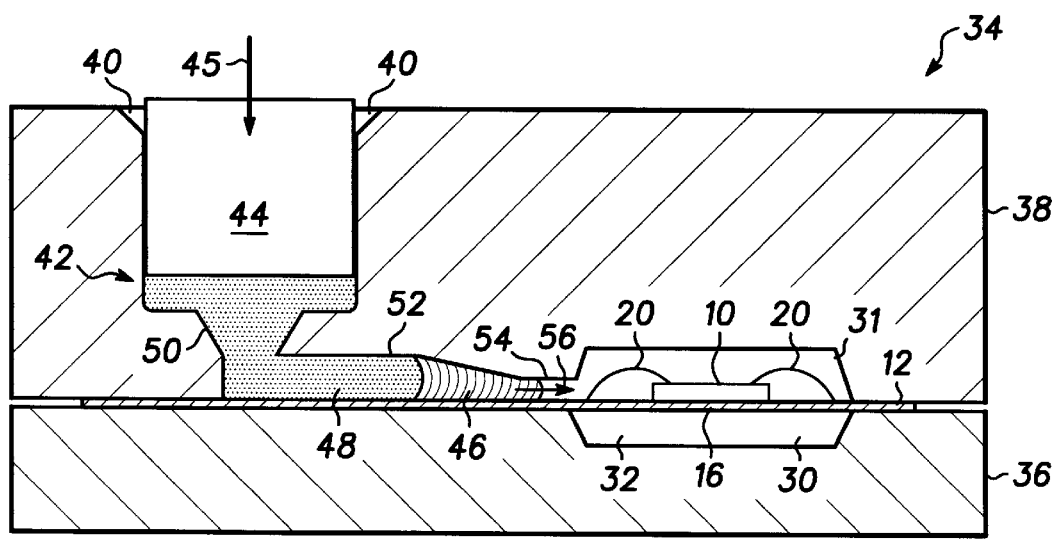
FIG. 4 is a view similar to FIG. 3 but after start of injection of the encapsulant into the mold but before it reaches the mold cavity containing the device being encapsulated.
Figure 5:
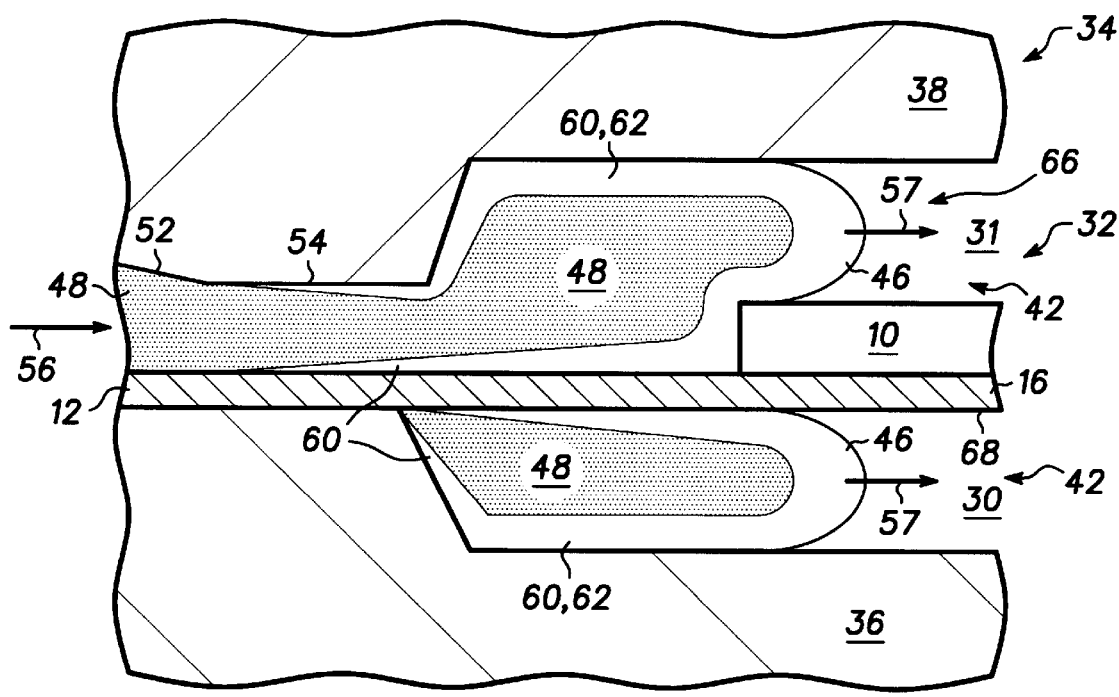
FIG. 5 is an enlarged view of a portion of FIGS. 3–4 at the left edge of the mold cavity, showing further details as the encapsulant enters the mold cavity around the device being encapsulated.

The present invention differs from the prior art in the choice of encapsulation material, the method of molding and the structure thereby obtained. FIGS. 3–5 are partial cut-away and cross-sectional side views of electronic device 10 on die flag 16 of leadframe 12 in mold cavity 30–32, showing different stages of the molding process, according to the present invention. For simplicity of illustration, in FIGS. 3–5 leadframe 12 is shown edge-on and without further details. Persons of skill in the art will understand how to position a leadframe in a mold.

Mold 34 has lower half 36 containing lower cavity 30 and upper half 38 containing upper cavity 31. Collectively, lower cavity 30 and upper cavity 31 make up device cavity 32 in which device 10 rests. The dimensions and shape of cavity 32 substantially determine (e.g., other than for shrinkage) the dimensions and shape of finished encapsulation 24' analogous to encapsulation 24 of FIGS. 1–2, surrounding device 10.

FIGS. 3–5 illustrate a transfer molding type of mold. Upper mold half 38 has opening 40 in which is placed molding material 42, surmounted by piston 44. Opening 40 and molding material 42 typically have a cylindrical shape. Molding material 42 is often referred to in the art as a "pill" because it usually has a pill-like shape. For similar reasons, opening 40 is generally referred to as the "pot". The mold press is generally loaded with plastic encapsulant by putting a "pill" in the "pot" but this is not essential. Any loading method can be used and opening 40, molding material 42 and piston 44 can have any convenient cross-sectional shape. Piston 44 travels in the direction of arrow 45 to inject plastic 42 into cavity 32. Below pot 40 is located aperture 50 leading to runner or channel 52 which extends from pot 40 toward cavity 32. The word "chamber", singular or plural, is used herein to generally refer to any passage or passages in the mold coupling the encapsulant reservoir, e.g., the "pot", to the mold cavity.

It is common to provide constricted region 54 in channel 52 immediately adjacent to cavity 32 so as to regulate the flow of encapsulant 42 into cavity 32. Constricted region 54 is referred to in the art as a "gate". Further, cavity 32 is generally made up of lower cavity 30 in mold portion 36 and upper cavity 31 in mold portion 38. This makes it easy to put device-leadframe assembly 14 into the mold and remove it after encapsulation. Gate 54 and cavity 32 are constructed so that encapsulant material flowing through channel 52 and gate 54 into cavity 32 goes into both lower cavity 30 and upper cavity 31. Means for directing the encapsulant into both portions of cavity 32 are well known.

The present invention differs from the prior art in that plastic 42 is not homogeneous. Rather, it has first material 46 which makes up lower portion 47 and second material 48 which makes up upper portion 49. Materials 46 and 48 are chosen to have different properties. First material 46 is chosen, for example, to optimize adhesion of the encapsulant to leadframe 12 and/or device 10 and for its stability and compatibility in contact with device 10. It is important that first encapsulant material 46 not adversely affect the behavior and reliability of device 10, as might happen if it introduces surface charge or contaminant ions. If possible, first encapsulant material 46 should enhance the behavior and reliability of device 10.

Second material 48 is chosen to optimize overall mechanical, chemical, optical and electrical properties of the finished encapsulated device, i.e., the "package." For example, for semiconductor devices, unfilled polymers are often desirable for first material 46 and filled polymers are often desirable for second material 48.

Filled and unfilled encapsulant materials are readily available, as are suitable filling materials, such as, glass or ceramic powder, beads, fragments or fibers. The precise choices of the first and second materials depend upon the specific technical and cost objectives that the device designer must achieve. Important parameters are molding conditions, adhesion, dielectric strength, moisture and gas permeability, temperature dependence, expansion coefficient, light permeability, chemical stability, and so forth. Persons of skill in the art understand how these factors vary with choices of material and many such materials are commercially available from numerous sources.

A number of different types of encapsulant materials can be used. Among these are:

(i) Catalyzed materials, that is, materials that are non-solid until some time after they are activated by a catalyst or UV light or heat or other activating agent. These materials can be activated and while still liquid injected into the mold where they rapidly harden by catalytic reaction.

(ii) Thermoplastic materials, that is, materials that melt when heated so they can be injected into the mold. They re-solidify as they cool in the mold.

(iii) Thermosetting materials, that is, materials that liquefy when subjected to heat and pressure at the same time. When warmed and compressed they liquefy and can be injected into the mold. They rapidly solidify through chemical reaction (autocatalysis) after injection is complete. For convenience of explanation, FIGS. 3–5 are described assuming that the material being used is a thermosetting material, but this is not essential.

FIG. 3 illustrates the situation just after encapsulant material 42 has been placed in pot 40 and piston 44 lowered until it is in contact with encapsulant material 42. No injection of plastic 42 into cavity 32 has yet occurred. FIG. 4 illustrates the situation after piston 44 moving in the direction of arrow 45 in pot 40 has forced encapsulant 42 through aperture 50 and channel 52 into gate region 54, moving in the direction of arrow 56. As yet, no substantial amount of encapsulant 42 has entered cavity 32.

It has been found that by controlling the rate of travel of piston 44, the flow of encapsulant 42 can be made substantially laminar. When flow is laminar, then there is little or no mixing since turbulence is avoided. This is generally contrary to prior art practice where the occurrence of turbulent flow has been either ignored or encouraged in order to homogenize the flowing plastic.

The appearance of laminar flow under these circumstances is generally connected with the critical value of the Debora number D given by:

$$D = v_s * t_r \quad (1.1)$$

where $v_s$ is the velocity of shear deformation of the flowing encapsulant, $t_r$ is the relaxation time and * indicates multiplication. It has been found for a number of polymers that the threshold value $D_{th}$ of D for laminar flow is about $D_{th}$=5. The velocity v of the flowing plastic is related to the Debora number by:

$$D = v_s * t_r = (v/h_o) * t_r, \quad (1.2)$$

where $h_o$ is the height of the flowing plastic. Thus, $$D_{th} = (v_{th}/h_o) * t_r, \quad (1.3)$$

where $v_{th}$ is the threshold velocity for laminar and turbulent flow. Below $v_{th}$, flow is increasingly laminar and above $v_{th}$ flow is increasingly turbulent. By simple rearrangement, $$v_{th} = (D_{th} * h_o)/t_r = 0.5 \text{ to } 5 \text{ mm/sec} \quad (1.4)$$

for $D_{th}$=5, $h_o$=1 mm and $t_r$ in the range of 10 to 1 seconds.

The velocity $v_{th}$ can vary with the choice of materials through changes in $D_{th}$ and $t_r$. For example, $t_r$ increases with increasing viscosity of the flowing plastic. Persons of skill in the art will understand based on the description herein how to choose appropriate materials and injection conditions to achieve the desired velocity.

It has been determined that under substantially laminar flow conditions (no substantial turbulence), first encapsulant material 46 is for the most part pushed ahead of second encapsulant material 48, less a small amount which forms laminar flow boundary layer 60 between encapsulant material 48 and the mold, leadframe and device surfaces over which encapsulant 42 is passing. This is illustrated in simplified form in FIGS. 4 and 5. The occurrence of substantially un-mixed boundary layer 60 is important to the present invention.

In FIG. 4, first encapsulant material 46 is still substantially in front of second encapsulant material 48. FIG. 5 is an enlarged view of a portion of mold 34 showing what happens, at an instant of time, as encapsulant 42 enters mold cavity 32 around device 10 and leadframe 12. Under substantially laminar flow conditions (i.e., no significant turbulence causing boundary layer mixing), first encapsulant material 46 feeds boundary layer 60 which coats the exposed surfaces of cavity 32, leadframe 12 and device 10 with a thin film of encapsulant material 46. This occurs while the balance of first encapsulant material 46 is still being pushed ahead of second material 48, at leading edge 66 of injecting plastic 42 moving in the direction of arrows 56. The process continues until mold cavity 32 is filled and encapsulant 42 surrounds device 10.

In FIG. 5, it is shown that plastic 42 enters both upper cavity 31 and lower cavity 30 from gate 54 at about the same time, but this is not essential. Lower cavity 30 can be fed from gate 54 or through holes in leadframe 12 elsewhere in cavity 32. In some molds, cavity 31 is filled first followed by cavity 30, or vice versa, or a combination thereof. These variations are suitable. Further, it is not essential that encapsulant 42 completely surrounds device 10 or die flag 16. For example, where it is desired that lower surface 68 of die flag 16 be exposed (e.g., to facilitate heat transfer), lower cavity 30 is omitted.

Figure 6:
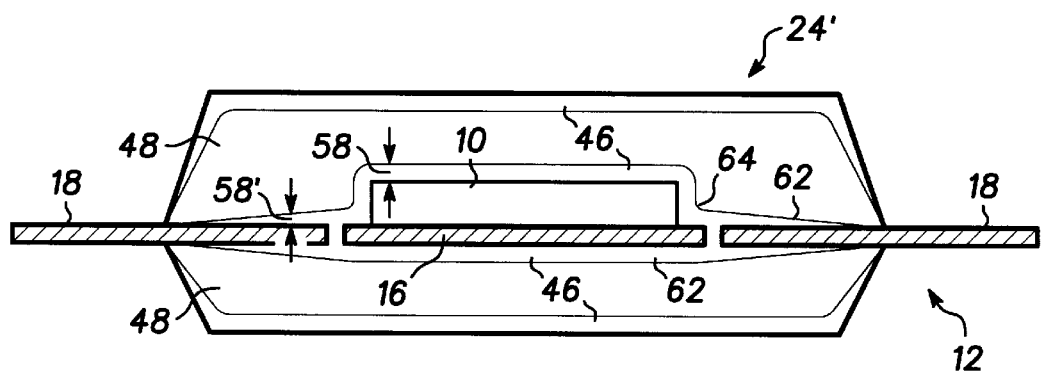
FIG. 6 is a simplified partial cut-away and cross-sectional view through an electronic device on a leadframe device after encapsulation according to the present invention.

It is important that encapsulant materials 46 and 48 be fed into the cavity so that substantially un-mixed boundary layer 60 is present and coats the desired surface portions of device 10 and leadframe 12 in cavity 32 with comparatively thin layer 62 of first encapsulant material 46 while second encapsulant material 48 fills the bulk of the space in cavity 32. Thus, the critical device and leadframe surfaces are coated with a material (e.g., 46) optimized for that purpose (e.g., surface adhesion and stability, etc.) while the bulk of encapsulation 24' around device 10 is made up of a different material (e.g., 48) optimized for its separate purpose (e.g., mechanical strength, low moisture permeability, etc.). This is more easily seen in FIG. 6 which is a simplified partial cut-away and cross-sectional view through electronic device 10 on leadframe 12 after encapsulation and lead trim, according to the present invention. In FIG. 6, the dam bars and excess portions of leadframe 12 have already been clipped off, as is customary in the art.

It will be seen in FIG. 6 that there is thin coating 62 of first encapsulant 46 on the surfaces of leadframe 12 and device 10 enclosed within encapsulation 24', while the bulk of encapsulation 24' is made up of second encapsulant material 48. The thickness of coating 62 provided by first encapsulant material 46 can be varied by varying the relative amount of material 46 to material 48. It is generally desirable that thickness 58 of coating 62 of first encapsulant 46 on die 10 be in the range of about 0.0001 to 1 mm, more conveniently in the range of about 0.001 to 0.5 mm, and preferable about 0.01 to 0.1 mm, but larger or smaller amounts can also be used depending upon the size of the device being encapsulated. In general, thickness 58' of coating 62 of first encapsulant material 46 on leadframe 12 adjacent die 10 will vary, but is desirably in the same general range of thickness as on die 10. A further advantage of the present invention is the tendency of first encapsulant material 46 to form fillets around and smooth over surface irregularities, as is illustrated for example at 64. This further increases the adhesion of first encapsulant material 46 and thereby of composite encapsulation 24'.

While the forging description has referred to the encapsulation process as using laminar flow, persons of skill in the art will understand based on the description herein that perfect laminar flow is not required. What is important is that the flow be sufficiently non-turbulent so that substantially un-mixed boundary layer 60 be present in cavity 32 so as to coat the critical surfaces of die 10 and leadframe 12 with a thin layer 62 of first encapsulant material 46 as the combination of first and second encapsulant materials 46, 48 flow into or through cavity 32. By placing the first encapsulation material ahead of the second, main, encapsulation material and in injecting the encapsulant at a velocity below that threshold velocity which induces substantial mixing of the two encapsulant materials at the boundary layer, this requirement is achieved.

Figure 7:
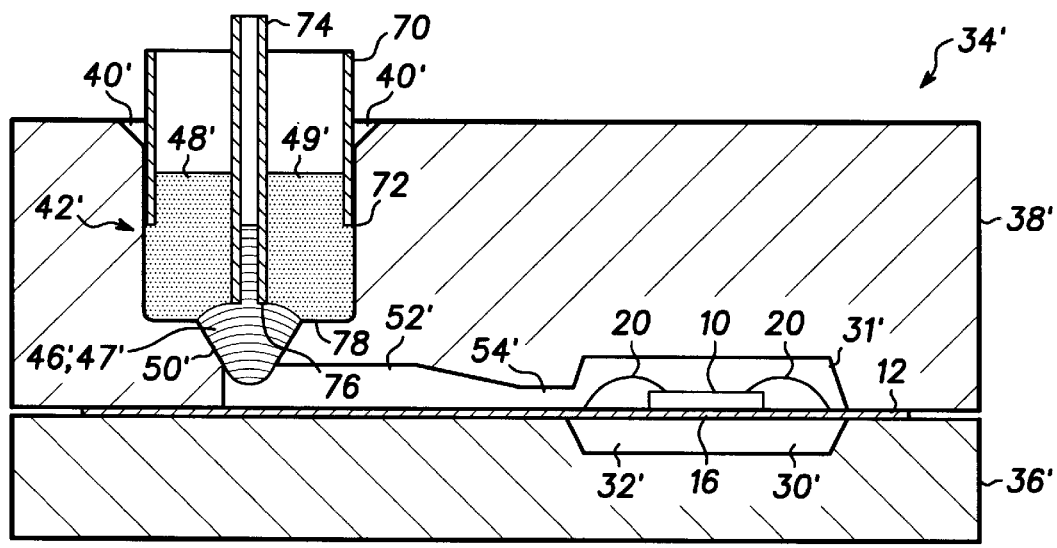
FIG. 7 is a view similar to FIG. 3 but according to a further embodiment of he present invention.

In FIG. 3, a composite "pill" of encapsulant material was placed in "pot" 40 and then, using heat and pressure, forced through aperture 50, channel or runner 52, and gate 54 into cavity 32. This arrangement is especially well suited to thermosetting materials which are initially solid and only liquefy for injection when heat and pressure are applied, e.g., by piston 44. Thermoplastic and catalyzed materials are generally already in a liquid state or easily melted. FIG. 7 is a view similar to FIG. 3 but according to a further embodiment of the present invention more suited to encapsulation using non-solid materials.

Referring to FIG. 7, mold 34' has cavity 32', gate 54', channel 52' and aperture 50' analogous to those of mold 34 of FIG. 3, but a different arrangement for introducing encapsulant 42'. It is assumed in connection with FIG. 7 that encapsulant materials 46', 48' are already in a non-solid state. Encapsulant materials 46', 48' have functions analogous to encapsulant materials 46, 48, respectively.

Mold 34' has opening or reservoir 40' in which are fitted two feed pipes, 70, 74. For convenience of explanation, feed pipes 70, 74 are shown as being concentric and entering from the top of mold 34', but this configuration is not essential. First pipe 74 is the means by which first encapsulant material 46' is introduced into mold 34' and second pipe 70 is the means by which second encapsulant material 48' is introduced into mold 34'. For convenience, pipe 74 has end 76 extending further toward bottom 78 of opening 40' than does end 72 of pipe 70. Pipes 74 and 70 conveniently terminate above bottom 78 of opening 40'. A pathway exists from the lower portion of reservoir 40' to aperture 50'.

Encapsulant 46' is, conveniently, fed through pipe 74 and deposited in aperture 50' and/or on bottom 78 of opening or reservoir 40' so that it will be at the leading edge 66' of plastic 42' as it enters channel 52', gate 54' and cavity 32'. Next, encapsulant 48' is fed through pipe 70 so that it is behind encapsulant 46'. In short, a slug of laminar layer forming encapsulant 46' is introduced into mold 34' ahead of main encapsulant 48', and then forced through the mold and into cavity 32 by main encapsulant 48' without substantial boundary layer mixing, just as has been previously described.

When encapsulant 46' and 48' are both in a liquid or semi-liquid state, they can be readily pumped through pipes 74, and 70 in the sequence described above so as to produce the situation depicted in FIG. 7 with encapsulant material 46' in position 47' and encapsulant material 48' in position 49'. Once the two encapsulants are in the relative positions shown (46' ahead of 48'), then by applying pressure to encapsulant 48', both encapsulants will be forced through the mold into the cavity. By regulating the pressure to control the flow velocity, substantial mixing of the two encapsulants (46', 48') in the chamber or chambers (e.g., 50', 52', 54') leading from reservoir 40' to cavity 32', is avoided. Hence, the two encapsulants flow in cavity 32 in the same relative manner as shown in FIG. 5 and laminar coating 62 of device 10 and important portions of leadframe 12 is achieved.

It will be noted that even though first and second encapsulant materials 46, 46' and 48, 48' are sequentially arranged at the mold entrance (see FIGS. 3–5 and 7), they flow into or through cavity 32 and around device 10 together. Device 10 becomes preferentially coated with layer 62, 62' of first material 46, 46' because it forms leading edge 66 of in-rushing plastic material 42, 42' and feeds boundary layer 60 adhering to the exposed cavity, device and leadframe surfaces. By avoiding significant mixing of the two materials during injection, boundary layer 60 is made up substantially entirely of first encapsulant material 46, 46'. It is from boundary layer 60 that coating 62 is obtained. Thus, materials 46, 46' and 48, 48' are delivered to their desired different destinations during the same in-rushing step, first material 46, 46' coating all or some of the exposed surfaces of device 10 and leadframe 12, and second material 48, 48' covering first material 46, 46' and filling most of the space of cavity 32 to form, for example, the majority of finished encapsulation 24'.

While the present invention has been described in terms of particular structures, steps, devices and materials, those of skill in the art will understand based on the description herein that it is not limited merely to such examples and that the full scope of the invention is properly determined by the claims that follow.

We claim:

1. A method for encapsulating an electrical component placed in a mold cavity, comprising:

placing an encapsulant having two portions into an entrance aperture of the mold, the entrance aperture being coupled to the cavity by a chamber, wherein the first portion is of a first molding material and the second portion is of a second molding material, the first portion being arranged so as to be first in line in a direction through the chamber to the cavity, the first molding material being more desirable for contact with a surface of the device than the second molding material; and transporting consecutively the first portion of the encapsulant and the second portion of the encapsulant through the chamber and into the cavity so as to at least partially cover the electrical component with the first molding material.

2. The method of claim 1 wherein the transporting step is carried out without substantial mixing of the first molding material with the second molding material.

3. The method of claim 1 wherein the transporting step is carried out so that the first molding material is substantially interposed between the electrical component and the second molding material.

4. The method of claim 1 wherein the transporting step is carried out so as to obtain substantially laminar flow of the encapsulant.

5. The method of claim 1 wherein the transporting step is carried out so as to maintain a velocity of movement of the encapsulant below a critical velocity for substantial mixing of the first and second materials.

6. The method of claim 1 wherein the transporting step is carried out so as to maintain a velocity of movement of the encapsulant below a critical velocity for substantial turbulent flow of the encapsulant.

7. The method of claim 1, wherein the electrical component is selected from the group consisting of semiconductor die, sensors, acousto-optical devices, and printed circuit boards.

8. A method for encapsulating an electronic component, comprising the steps of:

placing the electronic component in a mold cavity;

placing a first mold compound and a second mold compound into a container coupled to the mold cavity via an opening, wherein the first mold compound is proximal to the opening; and injecting the first mold compound into the cavity via the opening, wherein the first mold compound at least partially covers the electronic component, and then injecting the second mold compound through the same opening so that the mold compound covers the first mold compound.

9. The method of claim 8, wherein the electronic component is an integrated circuit.

10. The method of claim 8, wherein the electronic component is a semiconductor die.

11. The method of claim 8, wherein the first mold compound and the second mold compound are nonhomogeneous.

12. The method of claim 8, wherein the step of injecting includes injecting the first and second mold compounds such that they remain unmixed and have an unmixed boundary layer.

13. The method of claim 8, wherein the step of injecting includes injecting the first mold compound at a velocity below a threshold velocity, wherein mixing of the first and second mold compounds occurs at a velocity above the threshold velocity.

14. A method for forming a semiconductor device having a first layer substantially covering a semiconductor component and a second layer substantially covering the first layer, the method comprising the steps of:

supporting the semiconductor component in a cavity having an injection opening;

placing a first mold compound and a second mold compound into a receptacle at the injection opening;

injecting the first mold compound through the opening to cover a portion of the semiconductor component, whereby the first mold compound forms a first layer over the semiconductor component; and injecting the second mold compound through the opening, whereby the second mold compound forms a second layer, the second layer covering at least a portion of the first layer, wherein the semiconductor component, the first mold compound, and the second mold compound cooperate to form the semiconductor device.

15. The method of claim 14, wherein the semiconductor component is an integrated circuit.

16. The method of claim 14, wherein the steps of injecting the first and second mold compounds include injecting the first and second mold compounds at a velocity such that the first and second mold compounds remain substantially unmixed.

17. The method of claim 14, wherein the step of injecting first mold compound includes covering the whole semiconductor component.

18. The method of claim 14, wherein the step of supporting the semiconductor component includes supporting the semiconductor component in a cavity having a single injection opening.

* * * * *